US008537509B2

(12) United States Patent
Yoon

(10) Patent No.: US 8,537,509 B2
(45) Date of Patent: Sep. 17, 2013

(54) GROUND FAULT DETECTING AND CONTROLLING METHOD FOR PARALLEL-STRUCTURED HIGH VOLTAGE SYSTEM

(75) Inventor: Sang Yon Yoon, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 286 days.

(21) Appl. No.: 13/074,285

(22) Filed: Mar. 29, 2011

(65) Prior Publication Data

US 2012/0120530 A1 May 17, 2012

(30) Foreign Application Priority Data

Nov. 17, 2010 (KR) .................. 10-2010-0114172

(51) Int. Cl.
*H02H 3/00* (2006.01)
*H02H 9/08* (2006.01)

(52) U.S. Cl.
USPC ............. 361/42; 361/43; 361/44; 361/45; 361/46; 361/47; 361/48; 361/49; 361/50

(58) Field of Classification Search
None
See application file for complete search history.

(56) References Cited

U.S. PATENT DOCUMENTS

2010/0246081 A1* 9/2010 Yano et al. .............. 361/91.5

FOREIGN PATENT DOCUMENTS

| JP | 2005338010 A | 12/2005 |
|----|--------------|---------|
| JP | 2009081964 A | 4/2009  |
| JP | 2010019603 A | 1/2010  |

* cited by examiner

*Primary Examiner* — Dharti Patel
(74) *Attorney, Agent, or Firm* — Edwards Wildman Palmer LLP; Peter F. Corless

(57) ABSTRACT

The present invention relates to a ground fault detecting and controlling method for a parallel-structured high voltage system, and more particularly, such a ground fault detecting and controlling method for a parallel-structured high voltage system, in which it can be more precisely determined whether or not the system operation is emergently stopped based on individual insulation resistance values for respective items of the system, and it can be determined whether there is the possibility of temporary operation of the system in the emergency stop situation of the system operation. According to the present invention, a combined insulation resistance ground fault reference value is calculated based on individual insulation resistance values for respective items of the system, and the entire system is controlled by using the calculated combined insulation resistance ground fault reference value such that a high-accuracy ground fault detecting and controlling method can be provided.

6 Claims, 2 Drawing Sheets

GROUND FAULT DETECTING AND CONTROLLING METHOD FOR PARALLEL-STRUCTURED HIGH VOLTAGE SYSTEM

CROSS-REFERENCE TO RELATED APPLICATION

This application claims the benefit under 35 U.S.C. §119 (a) of Korean Patent Application No. 10-2010-0114172 filed in the Korean Intellectual Property Office on Nov. 17, 2010, the entire contents of which are incorporated herein by reference.

BACKGROUND OF THE INVENTION (a) Field of the Invention

The present invention relates to a ground fault detecting and controlling method for a parallel-structured high voltage system, and more particularly, such a ground fault detecting and controlling method for a parallel-structured high voltage system, in which it can be more precisely determined whether or not the system operation is emergently stopped based on individual insulation resistance values for respective items of the system, and whether there is the possibility of temporary operation of the system in an emergency stop situation of the system operation.

(b) Background Art

Recently, the spread of electric vehicles (EV), hybrid-electric vehicles (HEV), and other vehicles that rely on electric power has been expanded. Such electrically powered vehicles employ a plurality of items including a battery, which are connected in parallel to one another. In particular, in case of an electric bus high voltage system having a high parallel integration, as shown in FIG. 2, a plurality of items are driven which include 10 batteries, 3 motors and MCUs (Motor Control Units), an accessory inverter, and the like, which are all connected in parallel to one another.

Likewise, in the parallel-structured high voltage system in which the plurality of items are connected in parallel to one another, the measurement of the possibility of a dielectric breakdown of the system is critically important for stability of the system. Conventionally, a main battery management system (BMS) includes a ground fault detecting (GFD) circuit mounted thereon to measure a combined insulation resistance value of the system. Also, although each item of the system includes a separate ground fault detecting circuit, an insulation resistance value of a relevant item is not measured, but the combined insulation resistance value of the system is measured.

Accordingly, such a conventional prior art presents a problem because insulation resistance values of respective items of the parallel-structured system are not measured, but the total combined insulation resistance value of the system is measured. Thus, the possibility of a dielectric breakdown of respective items of the system is not actually measured. Therefore, when the detection of a ground fault is performed through the combined insulation resistance value of the parallel-structured system, even though an insulation resistance value of an individual item drops to less than an individual ground fault reference value (Rρ∈φ), a ground fault situation cannot be accurately determined.

In addition, where an insulation resistance value of an individual item does not drop to less than the individual ground fault reference value (Rref)(i.e., in a situation where a ground fault does not occur), and when the insulation resistance values of all the items are reduced, the combined insulation resistance value of the system may drop to less than a reference value. Accordingly, a ground fault situation of the system is erroneously recognized.

In other words, in a system in which a plurality of items are connected in parallel to one another, a definite criterion for judging the ground fault situation cannot be suggested by only the reference value for the entire system. Thus, the precise control of the system is impossible utilizing the conventional technique.

The information disclosed in this Background of the Invention section is only for enhancement of understanding of the background of the invention and should not be taken as an acknowledgment or any form of suggestion that this information forms the prior art that is already known to a person skilled in that art.

SUMMARY OF THE INVENTION

The present invention relates to a ground fault detecting and controlling method for a parallel-structured high voltage system, in which individual insulation resistance values for respective items of the system are measured through an auxiliary ground fault detector for each item of the system. Additionally, a combined insulation resistance ground fault reference value is calculated based on the measured individual insulation resistance value. The calculated combined insulation resistance ground fault reference value is compared with an actual combined insulation resistance value of the system so that it can be determined whether or not the system is in a ground fault situation and whether or not the system operation is emergently stopped.

The present invention also relates to a ground fault detecting and controlling method for a parallel-structured high voltage system, in which system determines whether or not a ground fault occurs in an individual item based on an individual insulation resistance value measured through each auxiliary ground fault detector when the system emergency service is suspended. When this occurs, a driver is informed that a temporary operation of the system can be performed where any ground fault does not occur in all the individual items.

In order to accomplish the above object, the present invention provides a method for detecting and controlling a ground fault in a parallel-structured high voltage system, the method including: (a) measuring and updating an end combined insulation resistance value ($R_{Tn}'$) of a high voltage power net and individual insulation resistance values ($R_1, \ldots, R_n$) of respective items of the system, and calculating and updating a combined insulation resistance ground fault reference value ($R_{TREF}$) based on the individual insulation resistance values ($R_1, \ldots, R_n$) in a previous system operation end step; (b) measuring a start combined insulation resistance value ($R_{Tn}$) of the high voltage power net, and comparing an error between the measured start combined insulation resistance value ($R_{Tn}$) and the end combined insulation resistance value ($R_{Tn}'$) in a present system operation start step; (c) measuring and updating the individual insulation resistance values ($R_1, \ldots, R_n$) of the respective items in real-time, and calculating and updating a combined insulation resistance value ($R_T$) based on the individual insulation resistance values ($R_1, \ldots, R_n$); and (d) comparing the combined insulation resistance value ($R_T$) measured at step (c) with the combined insulation resistance ground fault reference value ($R_{TREF}$) measured at step (a) in real-time, whereby if it is determined that an error between the start combined insulation resistance value ($R_{Tn}$) and the end combined insulation resistance value ($R_{Tn}'$) is equal to or greater than a reference value, or the combined insulation resistance value ($R_T$) is equal to or smaller than the combined insulation resistance ground fault reference value ($R_{TREF}$), the system operation is emergently stopped.

In some embodiments of the present invention, the combined insulation resistance ground fault reference value ($R_{TREF}$) measured at step (a) may be a combined insulation resistance value calculated by substituting the smallest value ($R_k$) of the individual insulation resistance values ($R_1, \ldots, R_n$) of the respective items with an individual ground fault reference value ($R_{ref}$).

In addition, in accordance with some embodiment of the present invention, the method may further include a step of measuring and updating the individual insulation resistance values ($R_1, \ldots, R_n$) of the respective items in the case where the system operation is emergently stopped, whereby if it is determined that there is any item having an insulation resistance value of less than the individual ground fault reference value ($R_{ref}$) among the individual insulation resistance values ($R_1 \ldots, R_n$) of the respective items, a controller of the relevant item determines that a ground fault occurs in the relevant item.

Moreover, in accordance with some embodiment of the present invention, if it is determined that there is no item having an insulation resistance value of less than the individual ground fault reference value ($R_{ref}$) among the individual insulation resistance values ($R_1 \ldots, R_n$) of the respective items, the controller of the relevant item outputs a signal indicating the possibility of a temporary operation of the system.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like. The present systems will be particularly useful with a wide variety of motor vehicles.

BRIEF DESCRIPTION OF THE DRAWINGS

The objects, features and advantages of the present invention will be more apparent from the following detailed description in conjunction with the accompanying exemplary drawings, in which.

DETAILED DESCRIPTION

Figure 1:
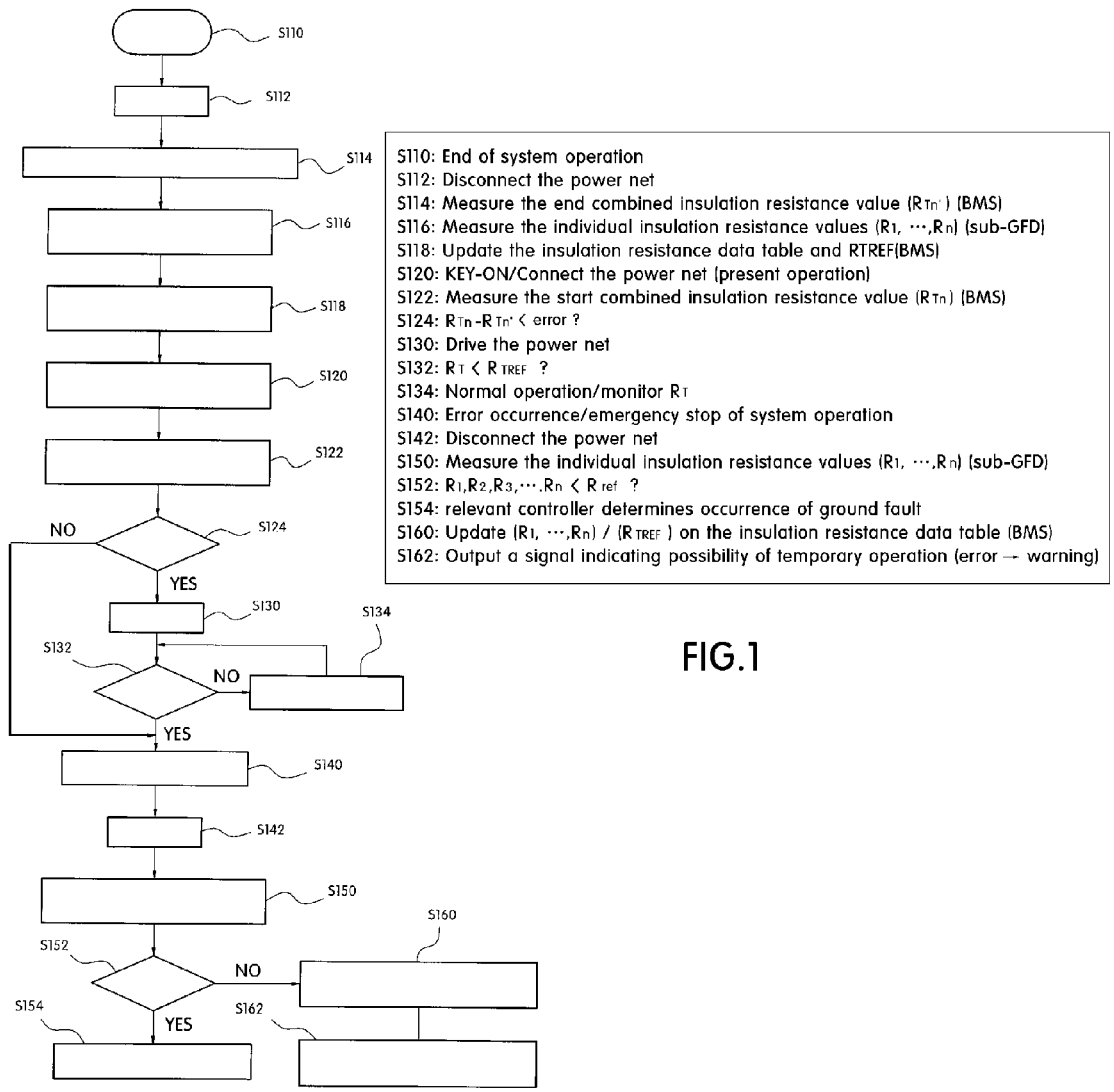
FIG. 1 is a flowchart illustrating an exemplary ground fault detecting and controlling method for a parallel-structured high voltage system according to a preferred embodiment of the present invention.
Figure 2:
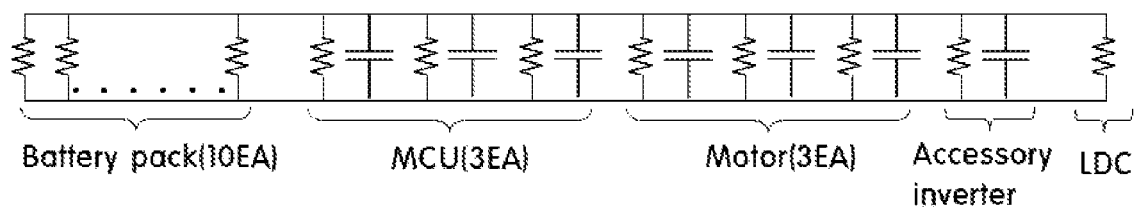
FIG. 2 is a schematic view illustrating an exemplary equivalent circuit of single items connected in parallel to an electric bus high voltage system.

Reference will now be made in detail to the preferred embodiment of the present invention, examples of which are illustrated in the drawings attached hereinafter, wherein like reference numerals refer to like elements throughout. The embodiments are described below so as to explain the present invention by referring to the figures.

Now, an exemplary embodiment of according to the present invention will be described hereinafter in detail with reference to the accompanying drawings such that those skilled in that art to which the present invention pertains can easily carry out the embodiment.

The present invention provides a method for detecting and controlling a ground fault in a parallel-structured high voltage system in which a controller in a vehicle measures and updates a first combined insulation resistance value of a high voltage power net and one or more individual insulation resistance values of each respective item of the system; and determines whether the system operation is emergently stopped based on individual insulation resistance values for respective items of the system.

More specifically, the present invention is directed to a ground fault detecting and controlling method for a parallel-structured high voltage system. In particular, a ground fault detecting (GFD) circuit may be incorporated into a main battery management system (BMS). Additionally, an auxiliary ground fault detector (sub-GFD) is incorporated into a circuit of a controller for an individual item of the system such that an individual insulation resistance value ($R_1, \ldots, R_V$) for each individual item is measured and the detection and control of the ground fault of the system is performed based on the result of the measurement.

For the sake of convenience of understanding, the meanings of phrases defined herein are as follows.

First, the phrase "individual insulation resistance values ($R_1, \ldots, R_n$)", as defined herein refers to insulation resistance values measured in respective items of the system. The phrase "individual ground fault reference value ($R_{ref}$)", as defined herein, refers to a reference value for judging a ground fault situation for an individual item of the system. Also, the phrase "end combined insulation resistance value ($R_{Tn}'$)", as defined herein, refers to a combined insulation resistance value measured in the main BMS upon a disconnection between a power net and each item by the end of the system operation, and the phrase "start combined insulation resistance value ($R_{Tn}$), as defined herein, refers to a combined insulation resistance value measured in the main BMS upon a connection between the power net and each item by the start of the system operation. A power net refers to an integral system which may include a power source such as a battery, a motor and a motor control unit (MCU).

As defined herein, the phrase "combined insulation resistance value ($R_T$)" refers to an entire combined resistance value in a situation where the system operation is performed. Also, the phrase "combined insulation resistance ground fault reference value ($R_{TREF}$)", as defined herein, refers to a reference value for judging a ground fault situation for the entire system.

Furthermore, respective items of the system may be connected in parallel to a high voltage power net. The high voltage power net and a DC terminal (DC link) of each controller may be connected or disconnected to or from each other by a relay. In addition, items respective controller may include an auxiliary ground fault detector (sub-GFD), which may be used to measure an insulation resistance value ($R_1, \ldots, R_n$) of a relevant item.

More specifically, in the parallel-structured high voltage system according to the present invention, the GFD circuit of the main BMS serves to measure both the end combined insulation resistance value ($R_{Tn}'$) upon disconnection between the power net and each item at the end of the system operation and the start combined insulation resistance value ($R_{Tn}$) upon connection between the power net and each item at the start of the system operation. Further, the main BMS can store the insulation resistance values ($R_1, \ldots, R_n$) of an individual item measured by each sub-GFD on a table (i.e., insulation resistance data table). Based on the stored insulation resistance value, the combined insulation resistance value ($R_T$) and the combined insulation resistance ground fault reference value ($R_{TREF}$) can be calculated, which will be described below.

FIG. 1 shows a method for ground fault detecting and controlling a parallel-structured high voltage system according to an embodiment of the present invention.

Initially, when a system operation is ended (S110), the power net is disconnected (S112). Thereafter, the process proceeds to step S114 where the GFD measures the end combined insulation resistance value ($R_{Tn}'$), and the process proceeds to step S116 where the sub-GFD measures the individual insulation resistance values ($R_1, \ldots, R_n$). Then, in step S118 the main MBS updates the table (i.e., insulation resistance data table) for the end combined insulation resistance value ($R_{Tn}'$) and the individual insulation resistance values ($R_1, \ldots, R_n$) stored therein.

That is, the insulation resistance values ($R_1, \ldots, R_n$) each item in the system respectively is measured at a point in time when the system operation is ended, i.e., when the power net is disconnected and before a DC link discharge logic of each controller is driven in order to satisfy the same condition. Thus, the point in time when the above values are measured may be when each item is disconnected from the power net, but a DC input terminal maintains the same voltage value together with a high voltage battery terminal Further, in some embodiments of the present invention, the main BMS can calculate the combined insulation resistance value ($R_T$) of the entire system based on the insulation resistance values ($R_1, \ldots, R_n$) stored therein through the following combined resistance equation:

$$R_T = \frac{1}{1/R_1 + 1/R_2 + 1/R_3 + \ldots + 1/R_n} \quad \text{[Equation 1]}$$

In this case, at step S118, the main BMS can calculate the combined insulation resistance ground fault reference value ($R_{TREF}$) based on Equation 1 obtaining the $R_T$ and the individual insulation resistance values ($R_1, \ldots, R_n$). That is, after the smallest value ($R_k$) of the individual insulation resistance values ($R_1, \ldots, R_n$) of respective items is selected and is substituted by the individual ground fault reference value ($R_{ref}$) ($R_k=R_{ref}$), the substituted individual ground fault reference value ($R_k=R_{ref}$) is substituted into the Equation 1 for finding the combined insulation resistance value ($R_T$) so that the combined insulation resistance ground fault reference value ($R_{TREF}$) according to the embodiment of the present invention can be calculated.

The combined insulation resistance ground fault reference value ($R_{TREF}$) calculated by the above process may updated in the insulation resistance data table on the main BMS. In the exemplary embodiment of the present invention, a difference between the combined insulation resistance ground fault reference value ($R_{TREF}$) and the combined insulation resistance value ($R_T$) can be minimized through the substitution of the smallest value ($R_k$) of the individual insulation resistance values ($R_1, \ldots, R_n$) by the individual ground fault reference value ($R_{ref}$). In other words, a controller of an item having the smallest insulation resistance value indicates the location where a ground fault occurs to the combined insulation resistance ground fault reference value ($R_{TREF}$) so that a strict detection of the ground fault situation can be performed and insulation stability of all the controllers can be ensured.

In the some embodiments of the present invention, through the above process, the end combined insulation resistance value ($R_{Tn}'$) and the combined insulation resistance ground fault reference value ($R_{TREF}$) are calculated in an end step of the previous operation. The end combined insulation resistance value ($R_{Tn}'$) and the combined insulation resistance ground fault reference value ($R_{TREF}$) can then be used to determine whether or not the system is in a ground fault situation in a present operation step.

First, at step S120, when the key is turned and the connection between the power net and each item is established to operate the system, the process proceeds to step S122 where the main BMS of the present invention loads the insulation resistance data table, and measures the start combined insulation resistance value ($R_{Tn}$) through an internal GFD circuit. Thereafter, the process proceeds to step S122 where the main BMS compares the measured start combined insulation resistance value ($R_{Tn}$) and the end combined insulation resistance value ($R_{Tn}'$) on the insulation resistance data table, and determines at step S124 whether or not an error therebetween is equal to or greater than a reference value.

In the high voltage system, if a time interval between the previous end step and the present start step is longer than a predetermined threshold insulation stability is destroyed and there is a high possibility that a difference between the end combined insulation resistance value ($R_{Tn}'$) and the start combined insulation resistance value ($R_{Tn}$) will increase. Thus, at step S124, if the error between the start combined insulation resistance value ($R_{Tn}$) and the end combined insulation resistance value ($R_{Tn}'$) stored in the insulation resistance data table is equal to or greater than the reference value, a determination is made that the system is in a ground fault situation and the process proceeds to step S140 where an emergency stop of the system operation can be performed. At this time, the system according to the illustrated embodiment of the present invention can output an error occurrence signal and disconnect the power net at step S142.

On the other hand, at step S124, if the error between the start combined insulation resistance value ($R_{Tn}$) and the end combined insulation resistance value ($R_{Tn}'$) is smaller than the reference value, a determination is made that the system is in a normal operation situation and the process proceeds to step S130 where the power net can be driven.

Accordingly, at step S134, in the normal operation situation, the combined insulation resistance value ($R_T$) can be measured and monitored in real-time. In the illustrated embodiment of the present invention, the combined insulation resistance value ($R_T$) can be calculated by measuring the individual insulation resistance values ($R_1, \ldots, R_n$) of respective items in real-time to update the insulation resistance data table on the main BMS, and substituting the updated the individual insulation resistance values ($R_1, \ldots, R_n$) into Equation 1. Alternatively, the combined insulation resistance value ($R_T$) may be calculated directly through the GFD on the main BMS.

In the illustrated embodiment of the prevent invention, at step S132, in order to determine whether or not the system is in the ground fault situation during the system operation, the combined insulation resistance value ($R_T$) and the combined insulation resistance ground fault reference value ($R_{TREF}$) stored in the insulation resistance data table may be compared with each other. If it is determined at step S132 that the combined insulation resistance value ($R_T$) is equal to or greater than the combined insulation resistance ground fault reference value ($R_{TREF}$), the process proceeds to step S134 where the system operation continues to be performed in the normal operation situation.

On the contrary, if it is determined at step S132 that the combined insulation resistance value ($R_T$) is smaller the combined insulation resistance ground fault reference value ($R_{TREF}$), the process proceeds to step S140 where it is determined that the system is in the ground fault situation and an emergency stop of the system operation can be performed. At this time, the system, according to the illustrative embodiment of the present invention, can output an error occurrence signal and disconnect the power net at step S142.

Next, at step S150, even in the emergency stop situation of the system operation, the individual insulation resistance values ($R_1, \ldots, R_n$) are measured through the sub-GFD before the DC Link discharge logic is driven. Then, the process proceeds to step S152 where each item's controller, respectively determines whether or not the measured individual insulation resistance values ($R_1, \ldots, R_n$) have dropped to less than the individual ground fault reference value ($R_{ref}$).

If it is determined at step S152 that there is any item having an insulation resistance value of less than the individual ground fault reference value ($R_{ref}$), the process proceeds to step S154 where a controller determines that a ground fault occurs in the relevant item and outputs an error occurrence signal. That is, in the emergency stop situation of the system, the individual insulation resistance values can be checked to track an item in which a ground fault occurs. Also, if there is a relevant item in which a ground fault occurs, the troubleshooting or replacement of the relevant item can be performed.

Contrarily, if it is determined at step S152 that there is no item having an insulation resistance value of less than the individual ground fault reference value ($R_{ref}$), this means that there is no item in which a ground fault occurs but the entire insulation resistance value drops. In this case, the present invention can inform a driver that a temporary operation of the system can be performed.

More specifically, first, at step S160, the individual insulation resistance values ($R_1, \ldots, R_n$), measured at step S150, are transferred to the main BMS, which in turn updates the insulation resistance data table. In this case, the main BMS may also update the combined insulation resistance ground fault reference value ($R_{TREF}$) based on the updated individual insulation resistance values ($R_1, \ldots, R_n$). Subsequently, the process proceeds to step S162 where the controller outputs a signal indicating the possibility of temporary operation of the system to allow a user to re-initiate the system and perform the temporary operation of the system. At this time, the error occurrence signal of the system is released and a warming signal may be generated.

Advantageously, according to the ground fault detecting and controlling method for a parallel-structured high voltage system of the present invention, a combined insulation resistance ground fault reference value may be calculated based on individual insulation resistance values for respective items of the system, and the entire system may be controlled by using the calculated combined insulation resistance ground fault reference value such that a high-accuracy ground fault detecting and controlling method can be provided.

In particular, the smallest value of the individual insulation resistance values of respective items may be substituted by the individual ground fault reference value to calculate the combined insulation resistance ground fault reference value such that a strict ground fault situation-determining reference value for the entire system can be presented, and thus precise system control can be performed.

In addition, in the case where an emergency stop of the system operation is performed by judging whether or not the system is in a ground fault situation, the item where a ground fault has occurred can be tracked by checking individual insulation resistance values for respective items of the system. If it is determined that the entire insulation resistance value drops in a situation where any ground fault does not occur in all the individual items, a driver can be advantageously informed that a temporary operation of the system can be performed.

The invention has been described in detain with reference to preferred embodiments thereof. However, it will be appreciated by those skilled in the art that changes and modifications may be made in these embodiments without departing from the principles and spirit of the invention, the scope of which is defined in the appended claims and their equivalents. Therefore, what those skilled in the art to which the present invention pertains easily derive from the detailed description and the embodiment of the present invention should be construed as falling within the scope of the present invention.

What is claimed is:

1. A method for detecting and controlling a ground fault in a parallel-structured high voltage system, the method comprising:
   measuring and updating, by a controller in a vehicle, a first combined insulation resistance value of a high voltage power net and one or more individual insulation resistance values of each respective item of the system;
   measuring a second combined insulation resistance value of the high voltage power net;
   comparing an error between the second combined insulation resistance value and the first combined insulation resistance value; and
   determining, by the controller in the vehicle, whether the system operation is emergently stopped based on individual insulation resistance values for respective items of the system.

2. The method of claim 1, further comprising calculating and updating a combined insulation resistance ground fault reference value based on the measured individual insulation resistance values.

3. The method of claim 2, further comprising
   measuring and updating the individual insulation resistance values of the respective items in real-time, and
   calculating and updating a third combined insulation resistance value based on the individual insulation resistance values; and
   comparing the third combined insulation resistance value with the combined insulation resistance ground fault reference value in real-time.

4. The method of claim 3 wherein if it is determined that the third combined insulation resistance value is equal to or smaller than the combined insulation resistance ground fault reference value, the system operation is emergently stopped.

5. The method of claim 1 wherein if it is determined that an error between the second combined insulation resistance value and the first combined insulation resistance value is equal to or greater than a reference value, the system operation is emergently stopped.

6. A circuit for detecting and controlling a ground fault in a high voltage system of a vehicle, the circuit comprising:
   a controller configured to measure and update a first combined insulation resistance value of a high voltage power net and one or more individual insulation resistance values of each respective item of the system, measure a second combined insulation resistance value of the high voltage power net, compare an error between the second combined insulation resistance value and the first combined insulation resistance value, and calculate a combined insulation resistance ground fault reference value based on the measured individual insulation resistance values, wherein the entire high voltage system is controlled using the calculated combined insulation resistance ground fault reference value to determine whether the high voltage system operation should be emergently stopped based on individual insulation resistance values.

* * * * *